(12) United States Patent
Bang et al.

(10) Patent No.: US 10,483,961 B2
(45) Date of Patent: Nov. 19, 2019

(54) CHARGE INJECTOR WITH INTEGRATED LEVEL SHIFTER FOR LOCALIZED MITIGATION OF SUPPLY VOLTAGE DROOP

(71) Applicant: Intel Corporation, Santa Clara, CA (US)

(72) Inventors: Suyoung Bang, Hillsboro, OR (US); Minki Cho, Hillsboro, OR (US); Pascal Meinerzhagen, Hillsboro, OR (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/925,396

(22) Filed: Mar. 19, 2018

(65) Prior Publication Data

US 2019/0288681 A1 Sep. 19, 2019

(51) Int. Cl.
*H03L 5/00* (2006.01)
*H03K 17/16* (2006.01)
*H03K 17/284* (2006.01)
*H03K 17/10* (2006.01)

(52) U.S. Cl.
CPC ......... *H03K 17/161* (2013.01); *H03K 17/102* (2013.01); *H03K 17/284* (2013.01)

(58) Field of Classification Search
CPC ...... H02M 3/07; G11C 16/0483; G11C 29/06; G11C 29/025
See application file for complete search history.

(56) References Cited

U.S. PATENT DOCUMENTS

| | | | | |
|---|---|---|---|---|
| 2002/0140494 | A1* | 10/2002 | Thomas | H02J 1/10 327/530 |
| 2009/0027104 | A1* | 1/2009 | Foley | H03K 3/0375 327/333 |
| 2013/0335867 | A1* | 12/2013 | Shinde | H02H 9/00 361/54 |
| 2016/0342166 | A1* | 11/2016 | Rodriguez | G05F 1/56 |
| 2017/0279348 | A1* | 9/2017 | Kulkarni | H03K 5/19 |

OTHER PUBLICATIONS

Bowman, K et al., "A 22nm all-digital dynamically adaptive clock distribution for supply voltage droop tolerance", IEEE J. Solid-State Circuits, vol. 48, No. 4, pp. 907-916, Apr. 2013.

(Continued)

*Primary Examiner* — Sibin Chen
(74) *Attorney, Agent, or Firm* — Green, Howard & Mughal LLP (57) ABSTRACT

An apparatus is provided which comprises: a first power supply rail to provide a first power supply voltage; a second power supply rail to provide a second power supply voltage, wherein the first power supply voltage is higher than the second power supply voltage; a first circuitry coupled to the first and second supply rails, wherein the first circuitry is to operate using the first supply voltage, and wherein the first circuitry is to inject charge on to the second power supply rail in response to a droop indication; and a second circuitry to detect voltage droop on the second power supply rail, wherein the second circuitry is to generate the droop indication for the first circuitry.

21 Claims, 9 Drawing Sheets

(56) References Cited

OTHER PUBLICATIONS

Das, S et al., "A self-tuning DVS processor using delay-error detection and correction", IEEE J. Solid-State Circuits, pp. 792-804, Apr. 2006.
Fischer, T, "A 90-nm variable frequency clock system for a power-managed Itanium architecture processor", IEEE J. Solid-State Circuits, pp. 218-228, Jan. 2006.
Grenat, A, "Adaptive clocking system for improved power efficiency in a 28nm×86-64 microprocessor", IEEE International Solid State Circuits Conf. (ISSCC) Dig. Tech. Papers, Feb. 2014, pp. 106-107.
Kurd, N et al., "Next generation Intel micro-architecture (Nehalem) clocking architecture", IEEE Symp. VLSI Circuits, Jun. 2008, pp. 62-63.
Nalamalpu, A, "Broadwell: A family of IA 14nm processor", IEEE Symp. VLSI Circuits, Jun. 2008, pp. 62-63.
Shibahara, S, "A 16nm finFET heterogenous nona-core SoC supporting ISO26262 ASIL B standard", IEEE J. Solid-State Circuits, vol. 52, No. 1, pp. 77-88, Jan. 2017.
Tokunaga, C, "A graphics execution core in 22nm CMOS featuring adaptive clocking, selective boosting and state-retentive sleep", IEEE International Solid State Circuits Conf. (ISSCC) Dig. Tech. Papers, Feb. 2014, pp. 108-109.

\* cited by examiner

CHARGE INJECTOR WITH INTEGRATED LEVEL SHIFTER FOR LOCALIZED MITIGATION OF SUPPLY VOLTAGE DROOP

BACKGROUND

High-frequency supply voltage (Vcc) droop degrades processor performance and its energy efficiency. The Vcc droop arises due to interaction of capacitors and inductive parasitic circuit components at board, package, and die levels with abrupt change of microprocessor switching activity or current (power) consumption. The droop results in delay of circuit operation in the die, limiting operating frequency or performance of the processor, requiring a voltage guard band margin on operating Vcc, and hurting energy efficiency.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Adaptive clock techniques are sometimes used to mitigate power supply droop issues. However, such techniques have design challenges as modification to clocking distribution network, phase/frequency-locked-loop (PLL or FLL) intellectual property (IP), and/or architectural change of the microprocessor are needed. Non-linear control (NLC) of the fully integrated voltage regulator (FIVR) technique globally injects charges to $V_{cc}$ when necessary. However, the global charge injection with $V_{cc}$ droop detection positioned in a place remote to the actual hot-spot limits its benefits due to inaccurate voltage droop detection and its limited response time. FIVR NLC also consumes large power due to conservative global charge injection regardless of the scope of the $V_{cc}$ droop, and droop aggressor location.

Some embodiments describe a charge injector (CI) to enable localized mitigation of $V_{cc}$ droop. The footprint (e.g., layout length and width) of the CI circuitry is small, and so it can be distributed across a die to improve response time, and it can be coupled with local $V_{cc}$ detection circuits to inject charge from a separate high voltage rail $V_{cc,H}$ to $V_{cc}$ for the droop mitigation, in accordance with some embodiments. In some embodiments, when the nearby $V_{cc}$ droop is observed, CI is triggered to inject charge into the local $V_{cc}$ rail, thereby avoiding overreaction (e.g., overshoot) upon $V_{cc}$ droop event and unnecessary power consumption as opposed to FIVR NLC. To operate under an extra-high-voltage $V_{cc,H}$ (e.g., EHV greater than a nominal operating voltage of transistors, where a nominal operating voltage is a voltage that does not cause reliability issue to a transistor that experiences the nominal operating voltage), the CI clamp of the CI is integrated with a level-shifter with both meeting transistor gate/junction Vmax reliability limits even when the load is in sleep mode (Vcc approximately 0 V). Here, the term "Vmax" generally refers to the maximum allowable voltage between two nodes of a transistor for a process node. A voltage higher than Vmax can cause reliability issues with the transistor. In some embodiments, the level-shifter comprises an asymmetric input pair structure to quickly turn on the CI clamp on the onset of a droop.

There are many technical effects of the various embodiments. For example, the CI of some embodiments can enable $V_{cc}$ droop reduction by up to 50%, which can be translated to improvement of microprocessor performance. The CI of various embodiments is applicable not only to microprocessor core, but also to other IP blocks. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that those elements of the figures having the same reference numbers (or names) as the elements of any other figure can operate or function in any manner similar to that described but are not limited to such.

Figure 1:
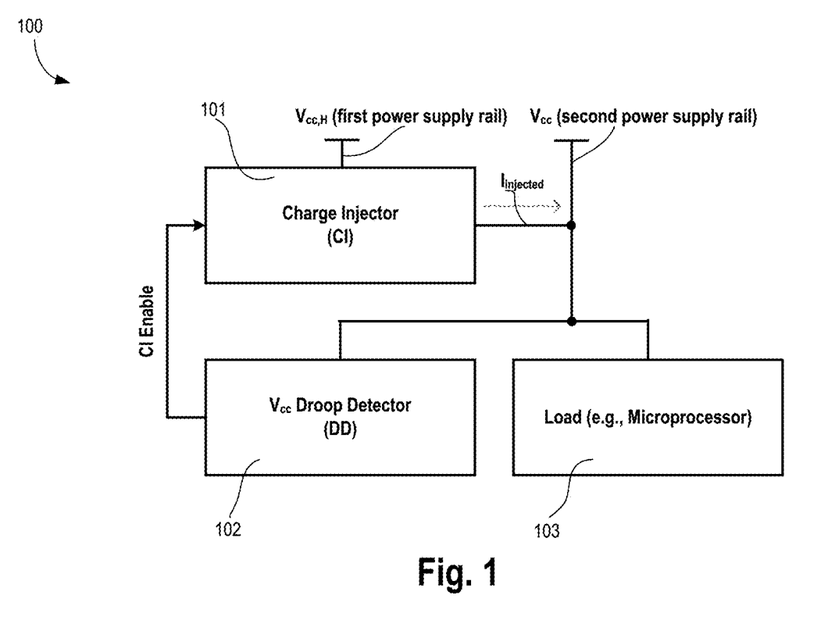
FIG. 1 illustrates a lumped charge-injector (CI) scheme for efficiency droop mitigation, in accordance with some embodiments.

FIG. 1 illustrates a lumped charge-injector (CI) scheme 100 for efficient $V_{cc}$ droop mitigation, in accordance with some embodiments. In some embodiments, scheme 100 comprises CI 101, $V_{cc}$ Droop Detector (DD) 102, and Load (e.g., microprocessor, cache, input-output (IO), group of circuits, etc.), first power supply rail $V_{cc,H}$, second power supply rail ($V_{cc}$ or $V_{cc,ungated}$), and CI Enable line. Here, names for nodes (or lines) and signals on those nodes (or lines) are interchangeably used. For example, CI Enable may refer to the signal CI Enable or the node CI Enable (or CI Enable line) depending on the context of the sentence. The power supply provided on the first power supply rail $V_{cc,H}$, is referred to the first power supply $V_{cc,H}$, and the power supply provided on the second power supply rail $V_{cc}$, is referred to the second power supply $V_{cc}$.

In some embodiments, DD 102 detects $V_{cc}$ droop, and enables CI 101 when $V_{cc}$ drops below a voltage threshold, that is detected by DD 102 as a timing shift. In some embodiments, when enabled, CI 101 injects charge, $I_{injected}$, from the extra-high-voltage on the first power supply rail $V_{cc,H}$ (e.g., $V_{cc,H}$ greater than a nominal voltage of transistors) into the second power supply rail $V_{cc}$ to mitigate $V_{cc}$ droop on the second power supply rail. As such, operating frequency (e.g., performance) and energy efficiency of the load 103 (e.g., microprocessor) improves.

Figure 2A:
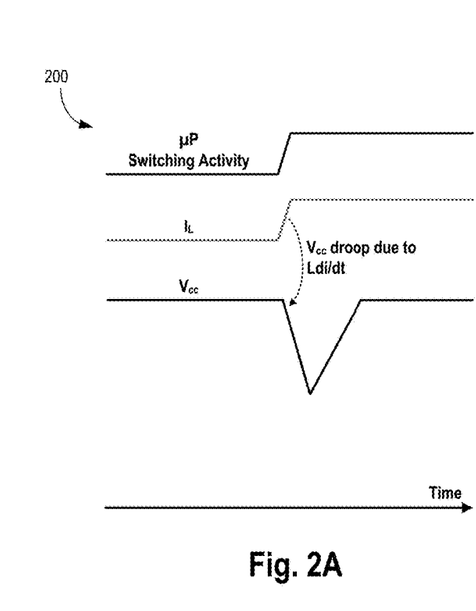
FIGS. 2A-B illustrate plots showing voltage droop without mitigation, and voltage droop with mitigation using the CI scheme, respectively, in accordance with some embodiments.
Figure 2B:
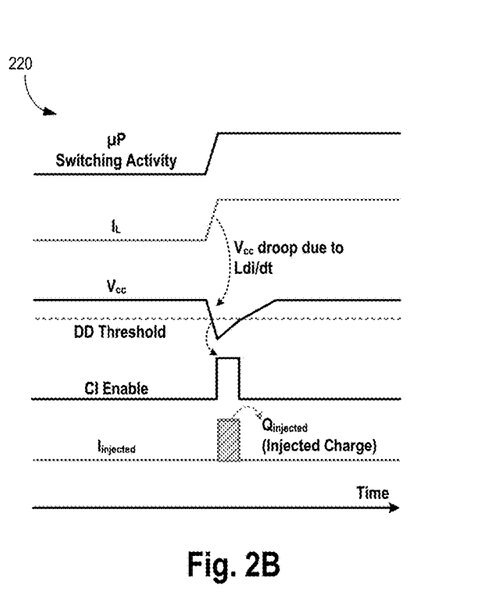

FIGS. 2A-B illustrate plots 200 and 220 showing voltage droop without mitigation, and voltage droop with mitigation using the CI scheme, respectively, in accordance with some embodiments. Here, the x-axis is time and y-axis is voltage, current, or logical level (e.g., 0 or 1). Plots 200 and 220 compare $V_{cc}$ droop behaviors of a microprocessor (e.g., load 103) without the CIs, and with the CIs of various embodiments.

Plot 200 shows three waveforms—microprocessor activity (μP switching activity), load current ($I_L$) on the second power supply line ($V_{cc}$), and the voltage on the second power supply line $V_{cc}$. Plot 200 shows that abrupt change in microprocessor switching activity results in abrupt load current $I_L$ change on the second power supply rail, and $V_{cc}$ droop (Ldi/dt) due to resonance of capacitors and inductive parasitics on the board, package, and die levels.

Plot 200 shows six waveforms—microprocessor activity (μP switching activity), load current ($I_L$) on the second power supply line ($V_{cc}$), and the voltage on the second power supply line $V_{cc}$, DD threshold, CI Enable, and injected current $I_{injected}$. Plot 220 shows that when $V_{cc}$ droop becomes lower than a DD threshold voltage, one or more CIs 101 of various embodiments are triggered by DD 102 via the CI Enable pulse and inject charges $Q_{injected}$ to the second power supply rail $V_{cc}$ to suppress the $V_{cc}$ droop on the second power supply rail.

Figure 3A:
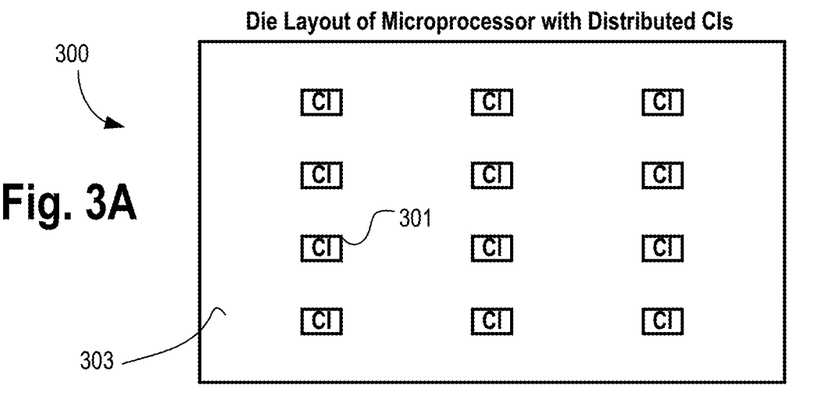
FIGS. 3A-C illustrate die layouts with various schemes of applying CIs, in accordance with some embodiments.
Figure 3B:
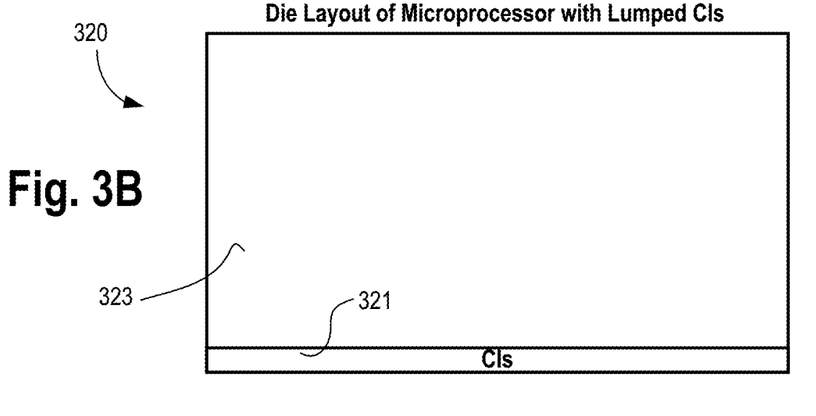
Figure 3C:
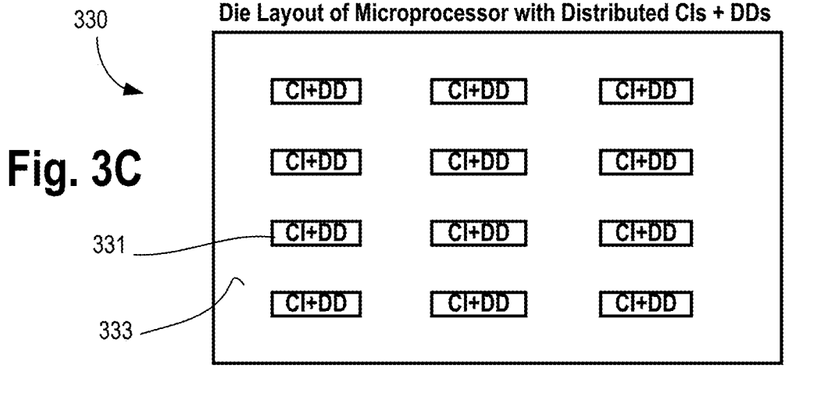

FIGS. 3A-C illustrate die layouts 300, 320, and 330, respectively, with various schemes of applying CIs, in accordance with some embodiments. Layout 300 illustrates a scheme where CIs 301 are distributed across a processor die 303 and share a same DD (not shown here). In some embodiments, DD 102 is positioned near a load or portion of the microprocessor die which is known to draw high currents at certain times. For example, DD is positioned at a hot-spot to capture the voltage droop on the second power supply line as soon as it is recognized because the DD is monitoring the voltage on $V_{cc}$ which is in close proximity to the load of interest.

Layout 320 illustrates a scheme where a lumped CI 321 is positioned along one portion of load 323 (e.g., microprocessor). In some embodiments, DD 102 (not shown here) may be distributed within microprocessor 323 to sense a voltage droop on $V_{cc}$ rail and for the CI 321 to react to the first indication of the voltage droop. In some embodiments, DD 102 is positioned near a load or portion of the microprocessor die 323 which is known to draw high currents at certain times. For example, DD is positioned to capture the voltage droop on the second power supply line as soon as it is recognized because the DD is monitoring the voltage on $V_{cc}$ which is in close proximity to the load of interest.

Layout 330 illustrates CI clamps and DDs (together referenced as 331) which are distributed across microprocessor die 333 for localized mitigation of $V_{cc}$ droop, resulting in a shorter distance from the CI to $V_{cc}$ of microprocessor, and smaller response time to mitigate the droop voltage. Small response time ensures smaller $V_{cc}$ droop, in accordance with various embodiments.

Figure 4:
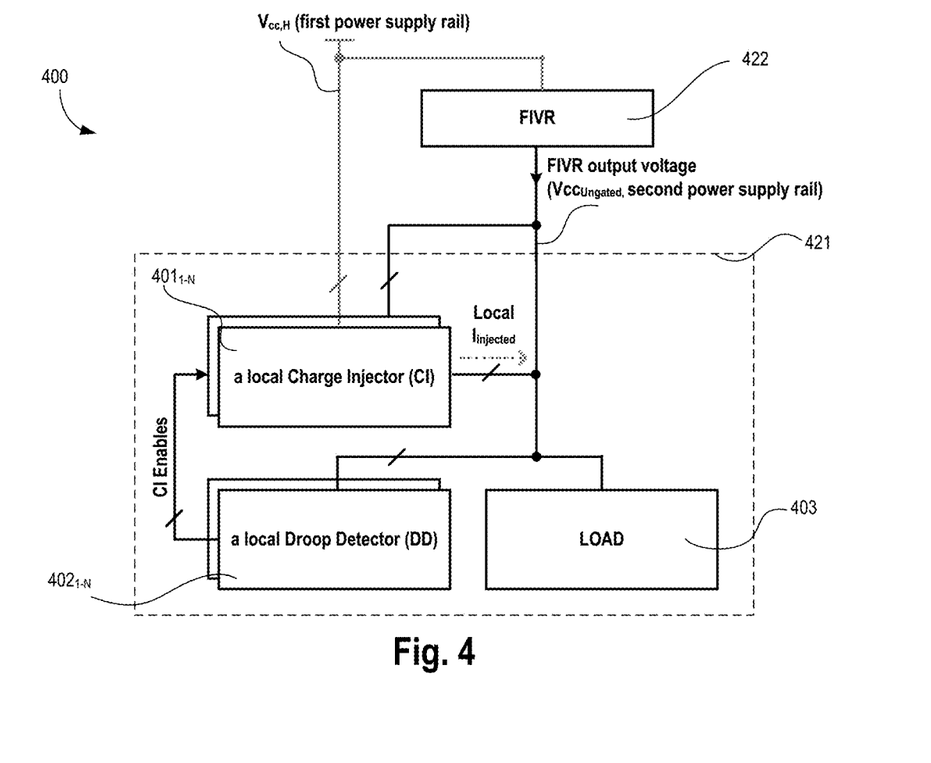
FIG. 4 illustrates a local CI scheme that injects charges from a first power supply rail to an un-gated power supply rail, in accordance with some embodiments.

FIG. 4 illustrates a local CI scheme 400 that injects charges from a first power supply rail to an un-gated power supply rail (also referred to as the second power supply rail), in accordance with some embodiments. In some embodiments, scheme 400 comprises a plurality of CIs $401_{1\text{-}N}$ (where, 'N' is an integer greater than one), plurality of associated or corresponding DDs $402_{1\text{-}N}$, load 403, first power supply line $V_{cc,H}$, second supply line $V_{cc}$, and a voltage regulator 422 (e.g., fully integrated voltage regulator (FIVR)) which may be situated outside the charge injector circuitry scheme 421.

In some embodiments, CIs $401_{1\text{-}N}$ can be distributed across die, so CIs $401_{1\text{-}N}$ can react to nearby $V_{cc}$ droop in a faster response time. Here, response time is determined by parasitic resistance and capacitance, which increases proportional to on-die distance from the voltage droop sensing point to the droop detector and then from the droop detector to the charge injection location. Therefore, a scheme based on local charge injection can react faster to $V_{cc}$ droop, in comparison to a lumped CI scheme, for example.

In some embodiments, CIs $401_{1\text{-}N}$ consumes merely necessary power upon $V_{cc}$ droop by injecting charges as needed into the affected local $V_{cc}$ rail, as opposed to traditional FIVR NLC which globally injects charges into all areas of the load supply rail resulting in waste of power and reliability and stability concerns. In one example, the spatio-temporally varying $V_{cc}$ droops within a die would make it important to have the droop sense line in a proper location such as load current hot spot region, but the hot spot may not always be determined in design time. Even if the hot spot location is pre-known, the latency of FIVR NLC due to the long distance between the droop sense and the charge injection locations results in incremental $V_{cc}$ droop mitigation (e.g., by 17%). In some embodiments, by having the CI near to the DD, which may be located near a pre-known hot spot location, the latency issue seen in FIVR NLC is mitigated and faster $V_{cc}$ droop reduction is achieved.

In some embodiments, CIs aims to leverage an existing high voltage in target systems such as a microprocessor with FIVR. In the absence of CIs, a microprocessor with FIVR with input voltage $V_{cc,H}$ (e.g., in a range of 1.6V-1.8V), is routed above the microprocessor for power delivery reasons, and the NLC collocated in FIVR utilizes $V_{cc,H}$ to globally inject charge into FIVR output voltage rails ($V_{cc,ungated}$). Distributed CIs $401_{1\text{-}N}$, in some embodiments, inject charges locally to $V_{cc,ungated}$ from the FIVR input voltage ($V_{cc,H}$), which is already available above load circuits. In some embodiments, CIs $401_{1\text{-}N}$ are enabled by nearby local droop detectors $402_{1\text{-}N}$ (that can be implemented as digital and/or analog detectors).

Figure 5:
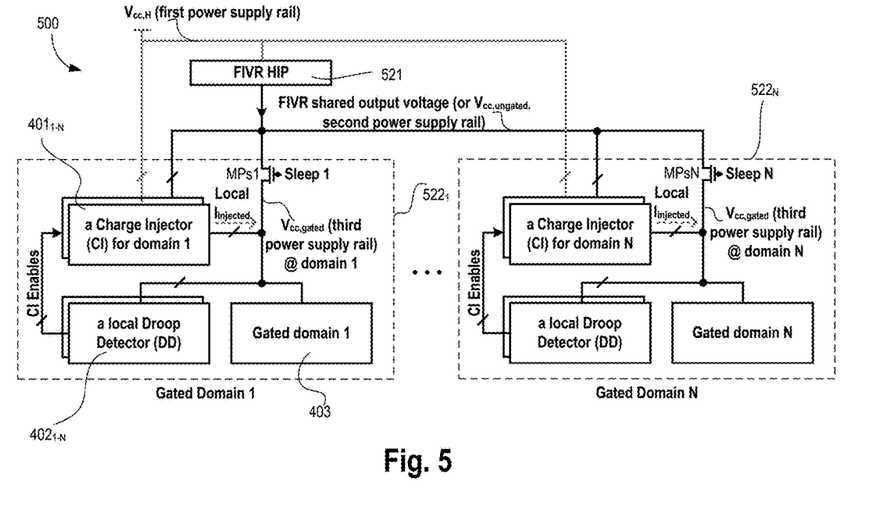
FIG. 5 illustrates a CI scheme for multiple gated power domains, in accordance with some embodiments.

FIG. 5 illustrates a CI scheme 500 for distributed gated power domains, in accordance with some embodiments. In scheme 500, FIVR 521 (or any voltage regulator such as Low dropout (LDO) regulator, buck regulator, boost regulator, and other types of DC-DC converters) provides an ungated supply $V_{cc,ungated}$ to 'N' gated domains $522_{1\text{-}N}$. Here, the term "gated" with reference to supply generally refers to an interruptible supply where a device (e.g., a sleep transistor) can interrupt flow of an un-gated power supply to another power supply rail (also referred to as the gated power supply rail $V_{cc,gated}$).

In some embodiments, each gated domain includes a sleep transistor (e.g., p-type transistor MPs1 in gated domain $521_1$ controllable by Sleep 1 signal, and p-type transistor MPsN in gated domain $521_N$ controllable by Sleep N signal). In some embodiments, for a microprocessor with FIVR 521 and multiple power domains $522_{1\text{-}N}$ with dedicated sleep transistors MPs1-MPsN to control sleep mode of multiple gated power domains independently, FIVR NLC 521 can be still used to globally inject charges to $V_{cc,ungated}$ power supply rail. For the same environment, in some embodiments, with multiple gated power domains, the CIs $401_{1\text{-}N}$ (for each gated domain) can also be used to inject charge into local gated supply voltage rail ($V_{cc,gated}$) without any reliability issue related to gate/junction $V_{MAX}$, even when a given local power domain is in sleep mode (with its $V_{cc,gated}\sim0$). In some embodiments, CI clamps $401_{1\text{-}N}$ and DDs $402_{1\text{-}N}$ are distributed across the microprocessor die for localized mitigation of $V_{cc}$ droop, resulting in a shorter distance to $V_{cc}$ of microprocessor, and smaller response time.

Figures 6A, 6B:
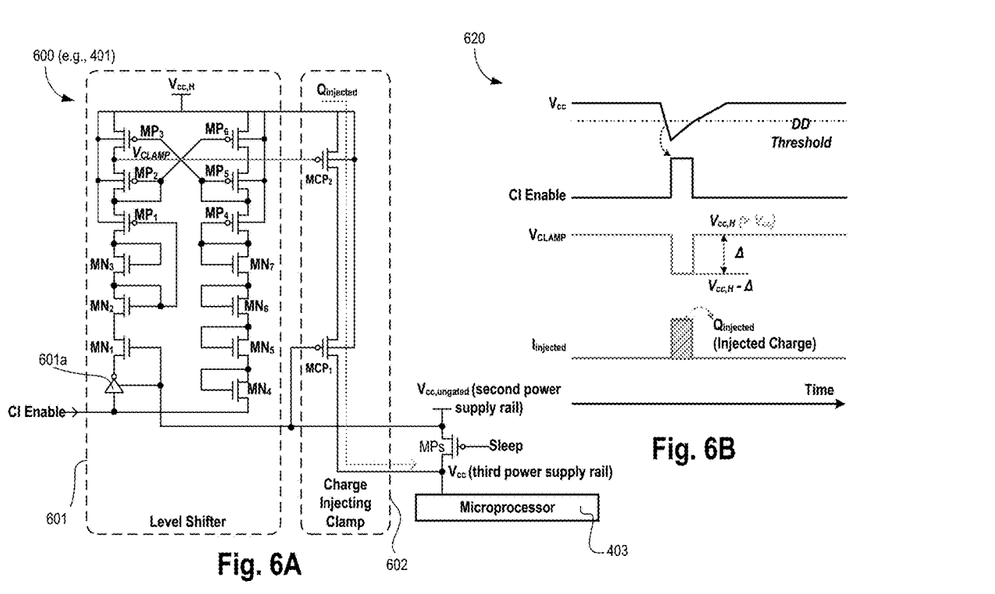
FIGS. 6A-B illustrate a schematic of a CI, and corresponding timing diagram, respectively, in accordance with some embodiments.

FIGS. 6A-B illustrate a schematic 600 of a CI (e.g., CI 401), and corresponding timing diagram 620, respectively, in accordance with some embodiments. In some embodiments, CI 600 comprises of level-shifter 601 and charge injecting clamp 602. In some embodiments, charge injecting clamp takes charges from the first power supply rail $V_{cc,H}$. In some embodiments, level-shifter 601 comprises inverter 601a, n-type transistors $MN_{1\text{-}7}$, and p-type transistors $MP_{1\text{-}6}$ coupled together as shown. In some embodiments, local charge sharing clamp 602 comprises p-type transistors $MCP_1$ and $MCP_2$ coupled together as shown.

In some embodiments, level-shifter 601 takes input of CI Enable from a local DD, and turns on local charge injecting clamp 602 by switching $V_{CLAMP}$ (gate voltage of transistor labeled as $MCP_2$) from $V_{cc,H}$ to $V_{cc,H}-\Delta$, where $\Delta$ is large enough to turn on transistor $MCP_2$.

In some embodiments, level-shifter 601 shifts the digital input enable signal (e.g., toggling between 0 and $V_{Cc}$) to voltage level between $V_{cc,H}$ and $V_{cc,H}-\Delta$, and it also limits the swing ($\Delta$) of $V_{CLAMP}$ to a process compliant level. In some embodiments, diode-connected transistors (e.g., transistors $MN_2$, $MN_3$, $MN_4$, $MN_6$, $MN_7$, $MP_1$, $MP_2$, $MP_3$, $MP_4$) in level shifter 601 are used to ensure that the gate and junction voltages across CI clamp transistors and level shifter transistors are always less than or equal to the gate/junction voltage $V_{MAX}$ limit under wide process corners and $V_{cc}$ range (e.g., $V_{cc,MAX}$ to 0.55V), for $V_{cc,H}$ of up to, for example, 1.8V.

In some embodiments, level-shifter 601 has asymmetric input pair structure with transistor $MN_1$, gate of which is biased with $V_{cc,ungated}$ (e.g., electrically the same level as $V_{cc}$), to quickly turn on clamp 602, and speed up response to droop detection for a more effective droop mitigation.

In some embodiments, for local charge injection at the gated voltage rail, during sleep mode in which $V_{cc,gated}$ approximately equals to 0 V, CI transistors are voltage compliant and safe from any reliability issues. In some embodiments, the CI clamp 602 with stacked-transistors ($MCP_1$ and $MCP_2$) ensures that the voltages of all nodes are within the process $V_{MAX}$ limit even during sleep (or low power mode). For example, the use of transistor $MCP_1$ at the bottom of CI clamp 602 with its gate connected to $V_{cc,ungated}$ isolates the top device $MCP_2$ from the gated rail. This ensure that transistor $MCP_2$ gate and junction voltages are within the $V_{MAX}$ as the intermediate node between transistors $MCP_1$ and $MCP_2$ is approximately clamped to $V_{cc,ungated}$ during sleep mode.

In some embodiments, depending on target operating range of $V_{cc}$ and voltage compliance requirement, which may be taken care of due to $V_{cc,H}$, the number of devices in transistor stack ($MN_1$-$MN_3$ and $MP_1$ on the left hand side of level-shifter 601, as well as transistors $MN_4$-$MN_7$ and $MP_4$ on the right hand side stack of level-shifter 601) can be adjusted. In some embodiments, for a wide operation range of $V_{cc}$ (e.g., from $V_{cc,MAX}$ down to 0.55 V), a relatively large number of devices are used in each stack, to avoid an extra voltage stress across an individual transistor in the stack. In one example, having more devices in the stack may have the drawback of limiting the swing (Δ) of $V_{CLAMP}$, decreasing the injected current level when CI is enabled, in return. In some embodiments, when a higher range of $V_{Cc}$ (e.g., $V_{cc,MAX}$ down to 0.85V) is targeted, where droop impact is more pronounced, the number of devices in the stack can be reduced (by reducing the number of diode connected devices), decreasing area overhead, and increasing the charge injected per CI.

Figure 7:
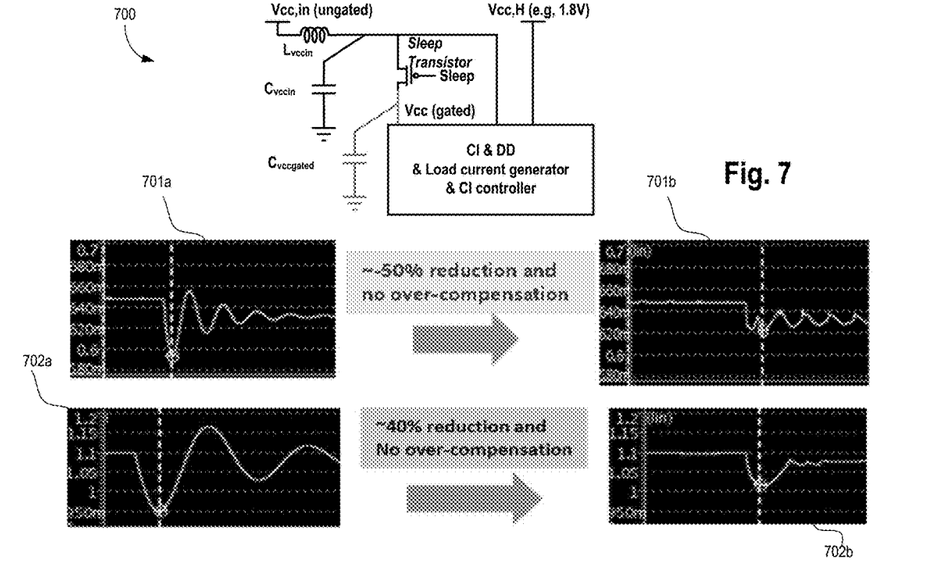
FIG. 7 illustrates plots showing voltage droop mitigation using the CI of various embodiments.

FIG. 7 illustrates a scheme 700 and plots 701a/b and 7021/b showing voltage droop mitigation using the CI of various embodiments. In this example, the CI and DD scheme of various embodiments results in 40-50 percent reduction in the droop level without over compensation. Here, 701a and 702a show $V_{cc}$ droop upon transient load current change without CI technique when target $V_{cc}$ is, for example, 0.65 V and 1.1 V. Plots 701b and 702b show transient $V_{cc}$ droop upon transient load current change with CI technique when target $V_{cc}$ is, for example, 0.65 V and 1.1 V.

Table 1 illustrates relative performance of the CI and DD scheme of various embodiments against a base-line design with no NLC and one with a FIVR NLC.

TABLE 1

| | Peak Current on FIVR input due to NLC/CI | Total Peak Current on FIVR input | FIVR Input Current Slope (di/dt) | Vcc Droop (V) |
| --- | --- | --- | --- | --- |
| Baseline (Without NLC, CI) | — | 0.974 | 1.00 | 1.000 |
| FIVR NLC | 1.00 | 1.000 | 0.224 | 0.731 |
| Proposed CI | 0.625 | 0.793 | 0.141 | 0.568 |

Table 1 shows that with fast local voltage droop detection and fast as-needed local CI, about 33% less droop is achieved compared to FIVR NLC (e.g., 0.568 vs. 0.731) potentially increasing speed bin splits by 1-2 bins. In some embodiments, local CI also offers 37% less voltage noise (di/dt) on FIVR input rail, which is useful for products where multiple cores with an independent FIVR each share a single FIVR input rail and some core(s) can cross-inject voltage noise onto other core(s) through this shared FVIR input rail. Simulation results of Table 1 also show that local CI results in lower droop on the power supply rail as compared to FIVR NLC, and also that FIVR input rail exhibits a smoother transition and so lower di/dt, due to fast, local, and as needed charge injection of local CI.

Figure 8:
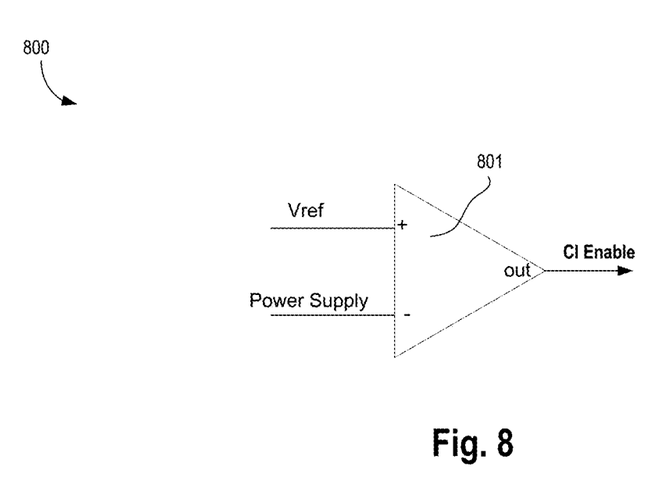
FIG. 8 illustrates a droop detector, in accordance with some embodiments.

FIG. 8 illustrates a droop detector 800, in accordance with some embodiments. In some embodiments, droop detector 800 comprises comparator 801 which compares the power supply voltage with a reference voltage (e.g., DD threshold) and generates and indication that tells whether the power supply voltage is above or below the threshold. In some embodiments, the reference voltage is generated by any suitable means (e.g., voltage divider, resistor ladder, bandgap circuit, etc.). While the schematic of FIG. 8 is one example of a droop detector, other implementations can also be used for the droop detector.

Figure 9:
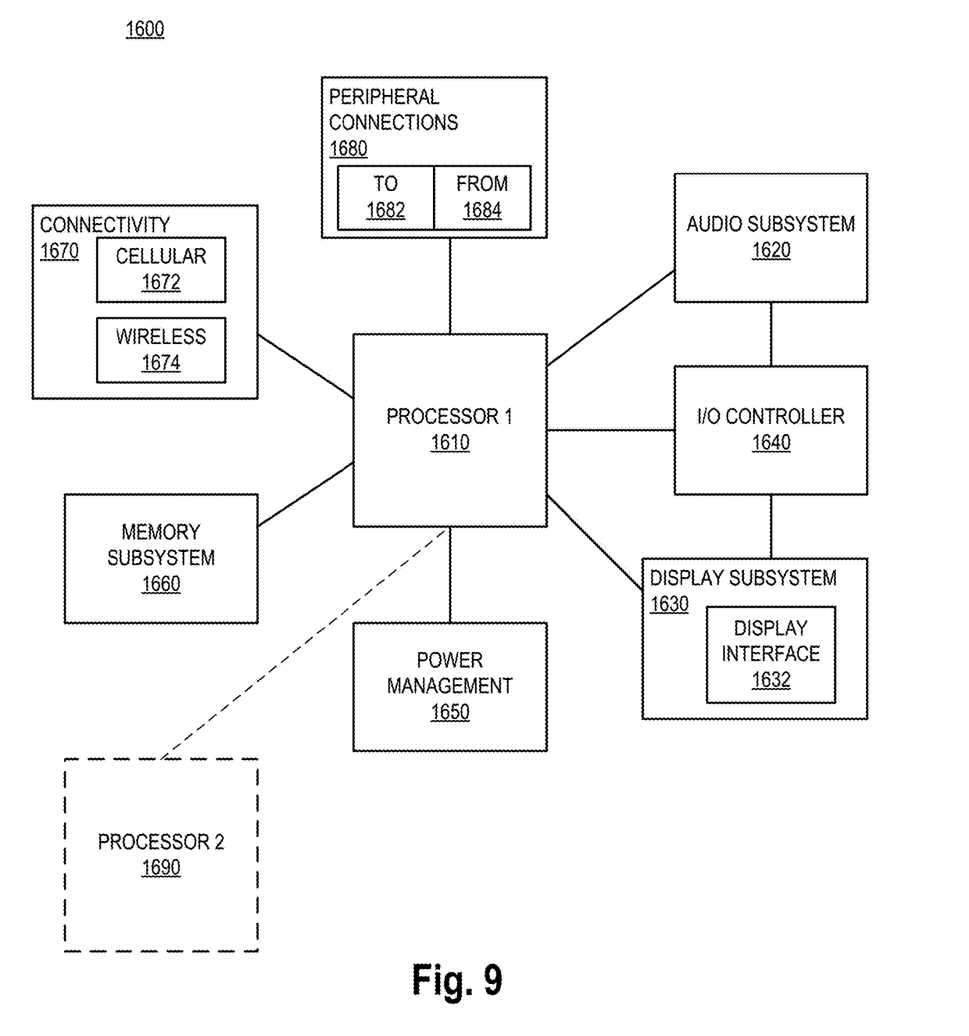
FIG. 9 illustrates a smart device or a computer system or a SoC (System-on-Chip) a CI scheme (lumped and/or distributed), according to some embodiments of the disclosure.

FIG. 9 illustrates a smart device or a computer system or a SoC (System-on-Chip) a CI scheme (lumped and/or distributed), according to some embodiments of the disclosure. It is pointed out that those elements of FIG. 9 having the same reference numbers (or names) as the elements of any other figure can operate or function in any manner similar to that described but are not limited to such.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having a CI scheme (lumped and/or distributed), according to some embodiments discussed. Other blocks of the computing device 1600 may also include a CI scheme (lumped and/or distributed), according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a first power supply rail to provide a first power supply voltage;
a second power supply rail to provide a second power supply voltage, wherein the first power supply voltage is higher than the second power supply voltage;
a first circuitry coupled to the first and second supply rails, wherein the first circuitry is to operate using the first power supply voltage, wherein the first circuitry is to inject charge on to the second power supply rail in response to a droop indication, wherein the first circuitry comprises a level-shifter with an asymmetric input pair circuitry, and wherein the asymmetric input pair circuitry is to turn on the first circuitry faster than turning the first circuitry off; and
a second circuitry to detect voltage droop on the second power supply rail, wherein the second circuitry is to generate the droop indication for the first circuitry.

2. The apparatus of claim 1, wherein the second circuitry comprises a comparator which compares the second power supply voltage with a reference and generates the droop indication when the second power supply voltage falls below the reference.

3. The apparatus of claim 1, wherein the droop indication is a pulse having a pulse width proportional to a duration of the voltage droop.

4. The apparatus of claim 1 comprises a voltage regulator coupled to the first and second power supply rails, wherein the voltage regulator is to regulate the second power supply voltage using the first power supply voltage as input.

5. An apparatus comprising:
a first power supply rail to provide a first power supply voltage;
a second power supply rail to provide a second power supply voltage, wherein the first power supply voltage is higher than the second power supply voltage;
a voltage regulator coupled to the first and second power supply rails, wherein the voltage regulator is to regulate the second power supply voltage using the first power supply voltage as input;
a transistor coupled to the second power supply rail and a third power supply rail, wherein the transistor is controllable by a low power mode signal;
a first circuitry coupled to the first and third supply rails, wherein the first circuitry is to operate using the first power supply voltage, and wherein the first circuitry is to inject charge on to the third power supply rail in response to a droop indication; and
a second circuitry to detect voltage droop on the third power supply rail, wherein the second circuitry is to generate the droop indication for the first circuitry.

6. The apparatus of claim 5, wherein the transistor is a p-type transistor.

7. The apparatus of claim 5, wherein the first circuitry comprises a level-shifter.

8. The apparatus of claim 5, wherein the first circuitry comprises an asymmetric input pair circuitry which is to turn on the first circuitry faster than turning the first circuitry off.

9. The apparatus of claim 5, wherein the second circuitry comprises a comparator which is to compare a third power supply voltage on the third power supply rail with a reference and is to generate the droop indication when the third power supply voltage falls below the reference.

10. The apparatus of claim 5, wherein the droop indication is a pulse having a pulse width proportional to a duration of the voltage droop.

11. A system comprising:
a memory;
a processor coupled to the memory, wherein the processor comprises multiple power domains that can be controlled independent from one another, wherein the multiple power domains include a first power domain and a second power domain, and wherein the processor comprises:
a first power supply rail to provide a first power supply voltage;
a second power supply rail to provide a second power supply voltage, wherein the first power supply voltage is higher than the second power supply voltage;
a voltage regulator coupled to first and second power supply rails, wherein the voltage regulator is to regulate a second power supply voltage using the first power supply voltage as input;
a first transistor coupled to the second power supply rail and a third power supply rail, wherein the first transistor and the third power supply rail are part of the first power domain;
a second transistor coupled to the second power supply rail and a fourth power supply rail, wherein the second transistor and the fourth power supply rail are part of the second power domain;
a first pair of first and second circuitries in the first power supply domain, wherein the first circuitry is to inject charge on the third power supply rail in response to a droop indication by the second circuitry, and wherein the second circuitry is to detect a voltage droop on the third power supply rail; and
a second pair of first and second circuitries in the second power supply domain, wherein the first circuitry of the second pair is to inject charge on the fourth power supply rail in response to a droop indication by the second circuitry of the second pair, and wherein the second circuitry of the second pair is to detect a voltage droop on the fourth power supply rail; and a wireless interface to allow the processor to communicate with another device.

12. The system of claim 11, wherein the first and second transistors are p-type transistors, wherein the first transistor is controllable by a first low power mode signal, and wherein the second transistor is controllable by a second low power mode signal.

13. The system of claim 11, wherein each of the first circuitries of the first and second pair comprise a level-shifter.

14. The system of claim 11, wherein each of the first circuitries of the first and second pair comprise an asymmetric input pair circuitry which is to turn on the first circuitry faster than turning the first circuitry off.

15. The system of claim 11, wherein the droop indication is a pulse having a pulse width proportional to a duration of the voltage droop.

16. The system of claim 11, wherein the multiple power domains includes a third power supply domain, wherein the processor comprises a third transistor coupled to the second power supply rail and a fifth power supply rail, and wherein the third transistor and the fifth power supply rail are part of the second power domain.

17. The system of claim 16, wherein the processor comprises a third pair of first and second circuitries in the third power supply domain, wherein the first circuitry of the third pair is to inject charge on the fifth power supply rail in response to a droop indication by the second circuitry of the third pair, and wherein the second circuitry of the third pair is to detect a voltage droop on the fifth power supply rail.

18. The system of claim 17, wherein the first circuitry of the third pair comprises an asymmetric input pair circuitry which is to turn on the first circuitry of the third pair faster than turning off the first circuitry of the third pair.

19. An apparatus comprising:
a first power supply rail to provide a first power supply voltage;
a second power supply rail to provide a second power supply voltage, wherein the first power supply voltage is higher than the second power supply voltage;
a first circuitry coupled to the first and second supply rails, wherein the first circuitry is to operate using the first power supply voltage, wherein the first circuitry is to inject charge on to the second power supply rail in response to a droop indication, and wherein the first circuitry comprises a level-shifter with an asymmetric input pair circuitry;
a second circuitry to detect voltage droop on the second power supply rail, wherein the second circuitry is to generate the droop indication for the first circuitry; and
a voltage regulator coupled to the first and second power supply rails, wherein the voltage regulator is to regulate the second power supply voltage using the first power supply voltage as input.

20. The apparatus of claim 19, wherein the second circuitry comprises a comparator which compares the second power supply voltage with a reference and generates the droop indication when the second power supply voltage falls below the reference.

21. The apparatus of claim 19, wherein the asymmetric input pair circuitry is to turn on the first circuitry faster than turning the first circuitry off.

* * * * *